United States Patent [19]

Bhatnagar et al.

[11] Patent Number: 5,627,385
[45] Date of Patent: May 6, 1997

[54] LATERAL SILICON CARBIDE TRANSISTOR

[75] Inventors: Mohit Bhatnagar; Charles E. Weitzel, both of Mesa, Ariz.

[73] Assignee: Motorola, Inc., Schaumburg, Ill.

[21] Appl. No.: 520,123

[22] Filed: Aug. 28, 1995

[51] Int. Cl.$^6$ .................................................. H01L 31/0312
[52] U.S. Cl. ............................ 257/77; 257/285; 257/409; 257/489
[58] Field of Search ........................ 257/77, 285, 409, 257/487, 489, 493

[56] References Cited

U.S. PATENT DOCUMENTS

| | | | |
|---|---|---|---|
| 5,385,855 | 1/1995 | Brown et al. | 257/77 |
| 5,448,081 | 9/1995 | Malhi | 257/77 |

OTHER PUBLICATIONS

V. Krishnamurthy et al., "Planar Depletion–Mode 6H–SiC MOSFETs", Inst. Phys. Conf. Ser. No. 137: Chapter 6, Paper presented at the 5th SiC and Related Materials Conf., Washington DC, 1993, pp. 483–486.

Primary Examiner—Mark V. Prenty
Attorney, Agent, or Firm—Eugene A. Parsons

[57] ABSTRACT

A lateral silicon carbide transistor (10) utilizes a modulated channel region (18) to form an accumulation region that facilitates a low on-resistance. A doped region of the channel layer forms a channel insert (14) that also lowers the on-resistance of the transistor (10). Field plates (23,24) are utilized to facilitate providing a high breakdown voltage. A high resistance layer (29) between the field plates (23,24) also assists in increasing the breakdown voltage and decreasing on-resistance of the transistor (10).

15 Claims, 1 Drawing Sheet

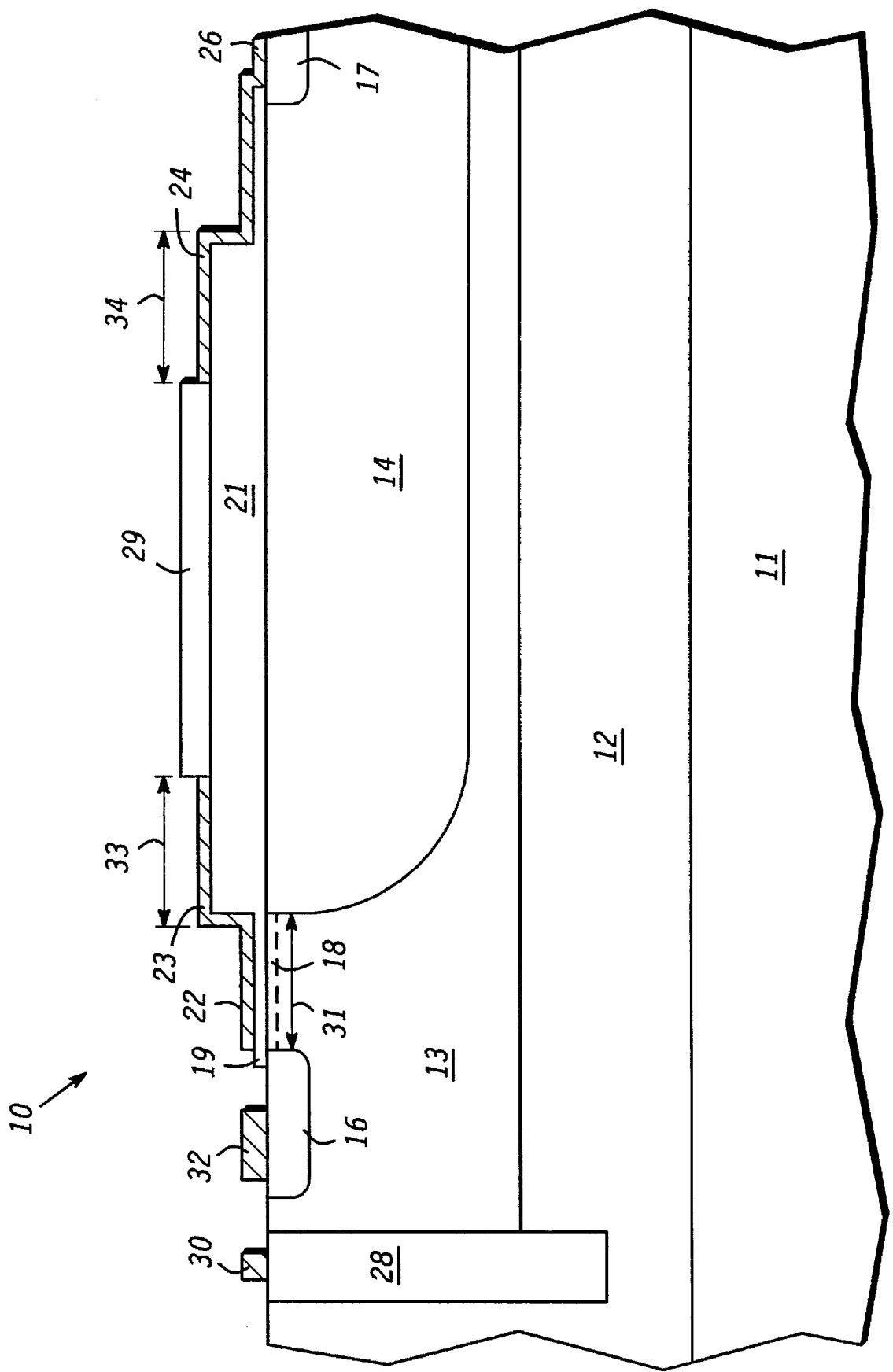

LATERAL SILICON CARBIDE TRANSISTOR

BACKGROUND OF THE INVENTION

The present invention relates, in general, to semiconductor devices, and more particularly, to silicon carbide semiconductor devices.

In the past, the semiconductor industry has utilized silicon carbide to form a variety of transistors including vertical transistors, lateral transistors, metal semiconductor field effect transistors (MESFETs), and metal oxide semiconductor field effect transistors (MOSFETs). One problem with the prior lateral MOSFETs, is the breakdown voltage. Typically, prior lateral MOSFETs have breakdown voltages less than approximately 100 volts. Such low breakdown voltages prevent utilizing the prior lateral MOSFETs in high voltage applications such as power devices for motor controls and power supplies. These type of applications typically require breakdown voltages of at least 150 volts.

Additionally, prior lateral MOSFETs that have a breakdown voltage greater than about 20 volts generally have high on-resistances. These on-resistances are greater than the less than 5 milliohm-cm² desired for power devices for motor controls and power supplies.

Accordingly, it is desirable to have a lateral silicon carbide MOSFET that has an on-resistance less than 5 milliohm-cm², and a breakdown voltage greater than 150 volts.

BRIEF DESCRIPTION OF THE DRAWINGS

The sole FIGURE illustrates an enlarged cross-sectional portion of a transistor in accordance with the present invention.

DETAILED DESCRIPTION OF THE DRAWINGS

The sole FIGURE illustrates an enlarged cross-sectional portion of a silicon carbide transistor 10 that has a high breakdown voltage and a low on-resistance. Transistor 10 includes a silicon carbide substrate 11 on which other portions of transistor 10 are formed. In the preferred embodiment, transistor 10 is a N-channel accumulation mode transistor and substrate 11 is heavily doped P-type silicon carbide. Substrate 11 could also be lightly doped N-type silicon carbide. A sub-channel layer 12 is epitaxially formed on substrate 11. Subsequently, a channel layer 13 is epitaxially formed on sub-channel layer 12. Layers 12 and 13 are formed by epitaxial techniques that are well known to those skilled in the semiconductor art. Sub-channel layer 12 has a first or P-type doping and channel layer 13 has a second or N-type doping in order to form a P-N junction at the interface of layers 12 and 13. The doping concentration and thickness of layers 12 and 13 are selected to provide a reduced surface field effect (RESURF) that lowers the on-resistance for a desired breakdown voltage of transistor 10. In the preferred embodiment, layer 12 has a P-type doping concentration of approximately $2 \times 10^{15}$ to $8 \times 10^{15}$ atoms/cm³ and a thickness of at least approximately five microns while layer 13 has an N-type doping concentration of approximately $0.8 \times 10^{16}$ to $2 \times 10^{16}$ atoms/cm³ and a thickness of approximately 0.3 to 0.8 microns in order to provide the RESURF effect.

A channel insert 14 is formed on a top surface of channel layer 13 in order to provide transistor 10 an on-resistance less than approximately five milliohm-cm². Insert 14 has an N-type doping concentration that is higher than the N-type doping concentration of channel layer 13. The thickness or depth of insert 14 typically is at least half the thickness of layer 13 and can extend all the way into layer 12. In the preferred embodiment, insert 14 has a doping concentration of approximately $1 \times 10^{17}$ to $5 \times 10^{17}$ atoms/cm³ and depth of approximately 0.3 to 0.8 microns in order to facilitate providing an on-resistance no greater than approximately three milliohm-cm². Additionally, the thickness and doping is chosen to facilitate the RESURF effect for a desired breakdown voltage.

A source region 16 is formed on the surface of channel layer 13 and is spaced a first distance 31 from insert 14. A source electrode 32 on source region 16 facilitates electrical contact to region 16. A modulated channel region 18 extends laterally from source region 16 to channel insert 14 near the surface of channel layer 13. A gate dielectric 19 is formed on the top surface of channel layer 13 and overlays region 18. Dielectric 19 also has one edge that substantially aligns with an edge of channel insert 14 in order to ensure that region 18 is electrically connected to channel insert 14. A gate electrode 22 is formed on the surface of gate dielectric 19 and has an edge that substantially aligns with the edge of channel insert 14. In operation, at zero gate-to-source bias or potential, region 18 is resistive and a small current flows from source region 16 to drain region 17, thus, a negative gate-to-source bias is required to prevent current flow. When a positive gate-to-source bias is applied, an accumulation region is formed in modulated channel region 18. The accumulation region accumulates electrons in order to provide a low resistance path for electron flow between source region 16 and insert 14 and subsequently to a drain region 17. It should be noted, that doping levels and gate materials can be selected that prevent current flow at zero gate-to-source bias.

Drain region 17 is formed on channel layer 13 and within channel insert 14. Drain region 17 is formed a sufficient distance from modulated channel region 18 to provide a high breakdown voltage for transistor 10. Additionally, the width of region 18 is sufficient to support the desired breakdown voltage. In the preferred embodiment, drain region 17 is at least approximately six microns from region 18, and region 18 is approximately one to four microns wide to ensure that transistor 10 can be substantially turned-off.

A thicker field dielectric 21 abuts gate dielectric 19 so that an edge of dielectric 19 substantially aligns with the edge of channel insert 14. Dielectric 21 also extends laterally across the surface of channel layer 13 toward drain region 17, and may overlap a portion of drain region 17. Dielectrics 19 and 21 can be a variety of materials such as silicon dioxide, silicon nitride, or aluminum nitride including multilayer conbinations thereof.

A gate field plate 23 abuts gate electrode 22 and extends a second distance 33 onto field dielectric 21 in order to terminate electric fields within transistor 10 and increases the breakdown voltage of transistor 10. Similarly, a drain field plate 24 has one end electrically connected to drain region 17 to form a drain electrode 26, and extends a third distance 34 onto field dielectric 21 in order to form an electrical field plate that terminates electric field lines and increases the breakdown voltage of transistor 10. The distance between plates 23 and 24 also affects the breakdown voltage of transistor 10, and is chosen to provide the desired breakdown voltage. In the preferred embodiment, distances 33 and 34 each are approximately five to ten microns, and the distance between plates 23 and 24 is approximately five to fifteen microns in order to achieve a breakdown voltage of at least approximately six hundred volts.

A high resistivity layer 29 is formed on dielectric 21 and extends between plates 23 and 24, and is electrically connected thereto. Layer 29 increases the breakdown voltage of transistor 10. Layer 29 also assists in creating a second accumulation layer within insert 14 and underlying both layer 29 and plates 33 and 34 thereby decreasing the on-resistance of transistor 10. Layer 29 can be formed from a variety of high resistance materials including, but not limited to, polysilicon and metal oxides such as titanium oxide. In the preferred embodiment, layer 29 is polysilicon having a resistivity of approximately ten to one thousand megohms/square.

An isolation plug 28 isolates transistor 10 from other devices on substrate 11 and provides electrical connection to layer 12. Plug 28 is a P-type region that typically is formed by implantation techniques. A contact 30 provides electrical contact to plug 28, and is typically connected to electrode 32.

By now it should be appreciated that there has been provided a silicon carbide transistor having both a high breakdown voltage and a low on-resistance. Utilizing gate and drain field plates and providing an optimal distance between the field plates provides the transistor with a high breakdown voltage. The channel insert facilitates reducing the transistor's on-resistance. Also, forming a P-N junction that facilitates RESURF effects also reduces the on-resistance. Forming an accumulation layer in the modified channel region results in an enhancement transistor that is easily controlled by external circuitry. Such a transistor is suitable for use in high voltage applications such as power devices for motor controls and power supplies.

We claim:

1. A silicon carbide transistor comprising:
   a silicon carbide substrate;
   a sub-channel layer of a first conductivity type on the substrate;
   a channel layer having a second conductivity type and a first doping concentration wherein the channel layer is on the sub-channel layer;
   a channel insert on the channel layer, the channel insert having the second conductivity type and a second doping concentration that is higher than the first doping concentration;
   a source region of the second conductivity type on the channel layer and spaced a first distance from the channel insert;
   a modulated channel region extending laterally from the source region to the channel insert;
   a gate electrode overlying the modulated channel region; and
   a drain region of the second conductivity type in connection with the channel insert.

2. The silicon carbide transistor of claim 1 wherein the substrate has the first conductivity type.

3. The silicon carbide transistor of claim 1 wherein the gate electrode has an edge that is substantially aligned to an edge of the channel insert.

4. The silicon carbide transistor of claim 3 wherein a gate dielectric is between the gate electrode and the channel layer.

5. The silicon carbide transistor of claim 1 wherein the drain region of the second conductivity type is positioned within the channel insert.

6. The silicon carbide transistor of claim 1 wherein the modulated channel region is approximately one to four microns wide.

7. The silicon carbide transistor of claim 1 further including a field dielectric on a surface of the channel layer and having an edge that is substantially aligned with an edge of the channel insert.

8. The silicon carbide transistor of claim 7 further including a field plate on the field dielectric.

9. The silicon carbide transistor of claim 1 further including a field dielectric on a surface of the channel layer and having an edge that is substantially aligned with an edge of the channel insert, and a high resistivity layer on the field dielectric and overlying a portion of the channel insert wherein the high resistivity layer is positioned between the modulated channel region and a drain region that is in the channel insert.

10. The silicon carbide transistor of claim 1 further including an accumulation region within the modulated channel region and extending from the source region to the channel insert, the accumulation region having electrons accumulated to support current flow between the source region and the channel insert wherein the accumulation region is formed by a positive potential between the source region and a gate electrode that overlies the modulated channel region.

11. A lateral silicon carbide transistor comprising:
    a silicon carbide substrate;
    an epitaxial sub-channel layer having a first doping concentration and a first conductivity type wherein the epitaxial sub-channel layer is on the substrate;
    an epitaxial channel layer of a second conductivity type and a second doping concentration that is greater than the first doping concentration wherein the epitaxial channel layer is on the sub-channel layer;
    a channel insert that is a doped area within the channel layer, the channel insert having the second conductivity type and a third doping concentration that is greater than the second doping concentration;
    a source region of the second conductivity type within the channel layer and spaced a first distance from the channel insert;
    a modulated channel region that is a portion of the channel layer between the channel insert and the source region;
    a drain region of the second conductivity type within the channel insert;
    a field dielectric on a surface of the channel layer, the field dielectric having an edge that is substantially .aligned with an edge of the channel insert; and
    a high resistivity layer on the field dielectric, the high resistivity layer overlying a portion of the channel insert.

12. The lateral silicon carbide transistor of claim 11 further including an accumulation region within the modulated channel region and extending from the source region laterally to the channel insert, the accumulation region having electrons accumulated to support current flow between the source region and the channel insert wherein the accumulation region is formed by a positive potential between the source region and a gate electrode that overlies the modulated channel region.

13. The lateral silicon carbide transistor of claim 11 wherein the second doping concentration is approximately $0.8 \times 10^{16}$ to $5 \times 10^{16}$ atoms/cm$^3$.

14. The lateral silicon carbide transistor of claim 11 wherein the third doping concentration is approximately $1 \times 10^{17}$ to $5 \times 10^{17}$ atoms/cm$^3$.

15. The lateral silicon carbide transistor of claim 11 further including a drain region of the second conductivity type within the channel insert wherein the high resistivity layer is positioned between the drain region and the modulated channel region.

* * * * *

UNITED STATES PATENT AND TRADEMARK OFFICE
CERTIFICATE OF CORRECTION

PATENT NO. : 5,627,385
DATED : May 6, 1997
INVENTOR(S) : Mohit Bhatnagar et al.

It is certified that error appears in the above-indentified patent and that said Letters Patent is hereby corrected as shown below:

In Claim 13, column 4, line 57, delete "$5 \times 10^{16}$", insert --$2 \times 10^{16}$--.

Signed and Sealed this

Second Day of December, 1997

Attest:

BRUCE LEHMAN

Attesting Officer

Commissioner of Patents and Trademarks